(12) United States Patent
Tsai et al.

(10) Patent No.: US 8,900,958 B2
(45) Date of Patent: Dec. 2, 2014

(54) EPITAXIAL FORMATION MECHANISMS OF SOURCE AND DRAIN REGIONS

(71) Applicant: Taiwan Semiconductor Manufacturing Company, Ltd., Hsin-Chu (TW)

(72) Inventors: Chun Hsiung Tsai, Xinpu Township (TW); Meng-Yueh Liu, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/719,826

(22) Filed: Dec. 19, 2012

(65) Prior Publication Data

US 2014/0170840 A1    Jun. 19, 2014

(51) Int. Cl.
| | |
|---|---|
| H01L 21/336 | (2006.01) |
| H01L 21/28 | (2006.01) |
| H01L 29/772 | (2006.01) |
| H01L 21/02 | (2006.01) |
| H01L 29/68 | (2006.01) |

(52) U.S. Cl.
CPC .......... *H01L 21/02518* (2013.01); *H01L 29/68* (2013.01)
USPC ........... 438/300; 438/285; 438/509; 438/585; 257/E21.09; 257/E21.409; 257/E21.431; 257/E29.242

(58) Field of Classification Search
None
See application file for complete search history.

(56) References Cited

U.S. PATENT DOCUMENTS

| | | | |
|---|---|---|---|
| 4,701,423 A | 10/1987 | Szluk | |
| 5,710,450 A | 1/1998 | Chau et al. | |
| 5,908,313 A | 6/1999 | Chau et al. | |
| 6,137,149 A | 10/2000 | Kodama | |
| 6,204,233 B1 | 3/2001 | Smith et al. | |
| 6,232,641 B1 | 5/2001 | Miyano et al. | |
| 6,238,989 B1 | 5/2001 | Huang et al. | |
| 6,274,894 B1 | 8/2001 | Wieczorek et al. | |
| 6,368,927 B1 | 4/2002 | Lee | |
| 7,030,012 B2 | 4/2006 | Divakaruni et al. | |
| 7,195,985 B2 | 3/2007 | Murthy et al. | |
| 7,652,328 B2 | 1/2010 | Yamasaki et al. | |
| 7,772,097 B2 | 8/2010 | Tomasini et al. | |
| 7,816,217 B2 | 10/2010 | Lin et al. | |
| 7,910,445 B2 | 3/2011 | Onoda | |
| 7,928,427 B1 | 4/2011 | Chang | |
| 8,012,840 B2 | 9/2011 | Ando | |
| 8,053,273 B2 | 11/2011 | Kammler et al. | |
| 8,207,523 B2 | 6/2012 | Tsai et al. | |

(Continued)

OTHER PUBLICATIONS

Bauer, M., "High throughput SEG of highly in-situ doped SiCP/SiP layers for NMOS devices using a Si3H8/SiH3CH3/PH3/Cl2 based CDE process," 2012, pp. 499-506, vol. 50, Issue 9, The Electrochemical Society, Prime 2012.

(Continued)

*Primary Examiner* — Kevin M Picardat
*Assistant Examiner* — Pamela E Perkins
(74) *Attorney, Agent, or Firm* — Slater & Matsil, L.L.P.

(57) ABSTRACT

The embodiments of mechanisms for forming source/drain (S/D) regions of field effect transistors (FETs) descried enable forming an epitaxially grown silicon-containing material without using $GeH_4$ in an etch gas mixture of an etch process for a cyclic deposition/etch (CDE) process. The etch process is performed at a temperature different form the deposition process to make the etch gas more efficient. As a result, the etch time is reduced and the throughput is increased.

20 Claims, 5 Drawing Sheets

(56) References Cited

U.S. PATENT DOCUMENTS

| | | |
|---|---|---|
| 2001/0023108 A1 | 9/2001 | Miyano et al. |
| 2003/0148563 A1 | 8/2003 | Nishiyama |
| 2005/0035408 A1 | 2/2005 | Wang et al. |
| 2005/0077570 A1 | 4/2005 | Nishinohara |
| 2005/0095799 A1 | 5/2005 | Wang et al. |
| 2005/0158931 A1 | 7/2005 | Chen et al. |
| 2006/0084235 A1 | 4/2006 | Barr et al. |
| 2006/0088968 A1 | 4/2006 | Shin et al. |
| 2006/0115933 A1 | 6/2006 | Ye et al. |
| 2006/0131665 A1 | 6/2006 | Murthy et al. |
| 2006/0148151 A1 | 7/2006 | Murthy et al. |
| 2006/0166414 A1 | 7/2006 | Carlson et al. |
| 2006/0228842 A1 | 10/2006 | Zhang et al. |
| 2006/0234504 A1 | 10/2006 | Bauer et al. |
| 2006/0289902 A1 | 12/2006 | Ping et al. |
| 2007/0096194 A1 | 5/2007 | Streck et al. |
| 2007/0148919 A1 | 6/2007 | Lin et al. |
| 2007/0200176 A1 | 8/2007 | Kammler et al. |
| 2007/0259501 A1 | 11/2007 | Xiong et al. |
| 2007/0287272 A1 | 12/2007 | Bauer et al. |
| 2008/0085577 A1 | 4/2008 | Shih et al. |
| 2008/0157091 A1 | 7/2008 | Shin et al. |
| 2008/0224212 A1 | 9/2008 | Lee et al. |
| 2009/0020820 A1 | 1/2009 | Baik et al. |
| 2009/0075029 A1* | 3/2009 | Thomas et al. ............... 428/173 |
| 2009/0085125 A1 | 4/2009 | Kim et al. |
| 2009/0236633 A1 | 9/2009 | Chuang et al. |
| 2009/0267118 A1* | 10/2009 | Chakravarti et al. .......... 257/288 |
| 2010/0025779 A1 | 2/2010 | Kammler et al. |
| 2010/0193882 A1 | 8/2010 | Hoentschel et al. |
| 2010/0219475 A1 | 9/2010 | Kronholz et al. |
| 2010/0221883 A1 | 9/2010 | Kronholz et al. |
| 2010/0244107 A1 | 9/2010 | Kronholz et al. |
| 2011/0117732 A1 | 5/2011 | Bauer et al. |
| 2011/0124169 A1 | 5/2011 | Ye et al. |
| 2011/0147828 A1 | 6/2011 | Murthy et al. |
| 2011/0212584 A9 | 9/2011 | Chakravarthi et al. |
| 2011/0266617 A1 | 11/2011 | Nakazawa et al. |
| 2011/0269287 A1 | 11/2011 | Tsai et al. |
| 2012/0032275 A1 | 2/2012 | Haran et al. |
| 2012/0056245 A1 | 3/2012 | Kang et al. |
| 2012/0104498 A1 | 5/2012 | Majumdar et al. |
| 2012/0181625 A1* | 7/2012 | Kwok et al. .................. 257/408 |
| 2012/0295421 A1* | 11/2012 | Brabant et al. ................ 438/478 |
| 2013/0056795 A1 | 3/2013 | Wu et al. |
| 2013/0157431 A1 | 6/2013 | Tsai et al. |
| 2013/0307076 A1 | 11/2013 | Cheng et al. |
| 2013/0328126 A1 | 12/2013 | Tsai et al. |

OTHER PUBLICATIONS

Fischer, P. R. et al., "Low Temperature Silcore Deposition of Undoped and Doped Silicon Films," 2006, pp. 203-215, vol. 3, Issue 2, ECS Transactions.

* cited by examiner

EPITAXIAL FORMATION MECHANISMS OF SOURCE AND DRAIN REGIONS

CROSS-REFERENCES TO RELATED APPLICATIONS

The present application is related to U.S. application Ser. No. 13/493,626, entitled "EPITAXIAL FORMATION OF SOURCE AND DRAIN REGIONS" filed on Jun. 11, 2012, which is incorporated herein by reference in its entirety.

TECHNICAL FIELD

The present disclosure relates generally to the field of semiconductor devices and, more particularly, to integrated circuits and fabrication methods thereof.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
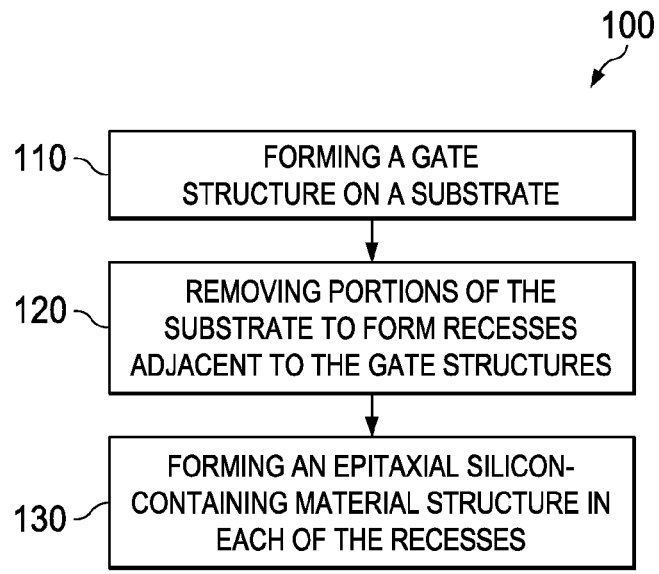
FIG. 1 is a flowchart illustrating an exemplary method of forming an integrated circuit.

It is understood that the following descriptions provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

As semiconductor devices, such as metal-oxide-semiconductor field effect transistors (MOSFETs), are scaled down through various technology nodes, strained source/drain features (e.g., stressor regions) have been implemented using epitaxial (epi) semiconductor materials to enhance carrier mobility and improve device performance. Forming a MOSFET with stressor regions often epitaxially grows silicon (Si) to form raised source and drain features for an n-type device, and epitaxially grows silicon germanium (SiGe) to form raised source and drain features for a p-type device. Various techniques directed at shapes, configurations, and materials of these source and drain features have been implemented to further improve transistor device performance. Although existing approaches have been generally adequate for their intended purposes, they have not been entirely satisfactory in all respects.

The embodiments will be described with respect to specific embodiments in a specific context, namely a source/drain region for a complementary metal-oxide semiconductor (CMOS) transistor. The embodiments may also be applied, however, to other doped regions within a semiconductor device.

Illustrated in FIG. 1 is a flowchart of a method of forming an integrated circuit, in accordance with some embodiments. FIGS. 2A-2E are schematic cross-sectional views of an integrated circuit during various fabrication stages, in accordance with some embodiments. The integrated circuit may include various passive and active microelectronic devices, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, FinFET transistors, or other types of transistors. It is understood that FIGS. 2A-2E have been simplified for a better understanding of the concepts of the present disclosure. Accordingly, it should be noted that additional processes may be provided before, during, and after the method 100 of FIG. 1, and that some other processes may only be briefly described herein.

Referring now to FIG. 1, the method 100 can include forming a gate structure over a substrate (block 110). The method 100 can include removing portions of the substrate to form recesses adjacent to the gate structure (block 120). The method 100 can also include forming a silicon-containing material structure in each of the recesses (block 130).

Figure 2A:
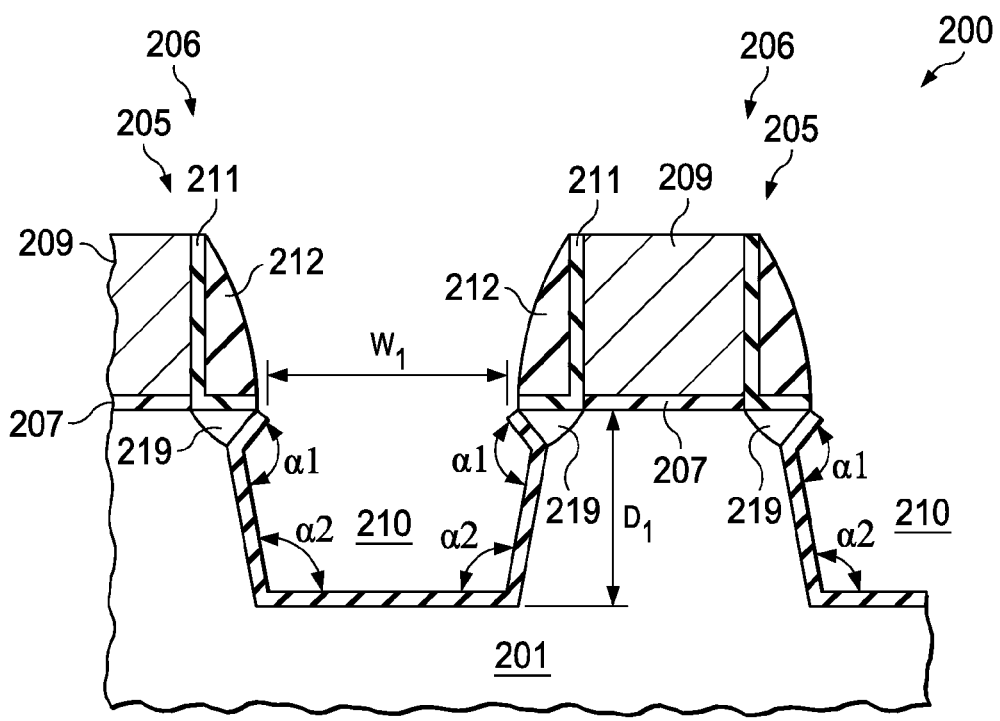
FIGS. 2A-2E are cross-sectional views of an integrated circuit during various fabrication stages, in accordance with some embodiments.

Referring now to FIGS. 2A-2E in conjunction with FIG. 1, an integrated circuit 200 can be fabricated in accordance with the method 100 of FIG. 1. In FIG. 2A, the integrated circuit 200 can be built on a substrate 201. Substrate 201 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. Substrate 201 may include an epitaxial layer (epi layer), and may be strained for performance enhancement.

In some embodiments forming n-type transistors, the substrate 201 can be a silicon substrate doped with a p-type dopant, such as boron (resulting in a p-type substrate). A metal gate structure can have a stack structure including a high dielectric constant gate layer, a diffusion barrier layer, a metal work function layer, a metallic layer, and/or other suitable layers. A dummy gate structure can have a stack structure including a dummy material layer, a hard mask layer, and/or other suitable layers.

In some embodiments, a gate stack 205 comprising a gate dielectric 207, a gate electrode 209, first spacers 211, and second spacers 212 may be formed over the substrate 201. The gate dielectric layer 207 includes a dielectric material, such as silicon oxide, silicon oxynitride, silicon nitride, a high-k dielectric material, or combinations thereof. Exemplary high-k dielectric materials include hafnium oxide ($HfO_2$), aluminum oxide ($Al_2O_3$), zirconium oxide ($ZrO_2$), gallium oxide ($Ga_2O_3$), titanium oxide ($TiO_2$), lanthanum oxide ($La_2O_3$), tantalum oxide ($Ta_2O_5$), gadolinium oxide ($Gd_2O_3$), yttrium oxide ($Y_2O_3$), hafnium dioxide-alumina ($HfO_2$-$Al_2O_3$) alloy, hafnium aluminum oxide (HfAlO), hafnium silicon oxide (HfSiO), hafnium silicon oxynitride (HfSiON), hafnium tantalum oxide (HMO), hafnium titanium oxide (HfTiO), hafnium zirconium oxide (HfZrO), titanium aluminum oxide (TiAlO), lanthanum aluminum oxide (such as $LaAlO_3$), other high-k dielectric material, or combinations thereof. The gate dielectric layer 207 may include a multilayer structure. For example, the gate dielectric layer 207 may include an interfacial layer formed over the substrate 201, and a high-k dielectric layer formed over the interfacial layer. The interfacial layer may be a silicon oxide layer formed by a thermal process or ALD process.

The gate electrode layer 209 is disposed over the gate dielectric layer 207. The gate electrode layer 209 includes a conductive material, such as polycrystalline silicon (polysilicon), aluminum (Al), copper (Cu), titanium (Ti), tantalum (Ta), tungsten (W), molybdenum (Mo), platinum (Pt), tantalum nitride (TaN), titanium nitride (TiN), tungsten nitride (WN), titanium aluminum (TiAl), titanium aluminum nitride (TiAlN), TaCN, TaC, TaSiN, other conductive material, or combinations thereof. The conductive material of the gate electrode layer 209 may be doped or undoped depending on design requirements of field effect transistor devices of integrated circuit 200. In some embodiments, the gate electrode layer 209 includes a work function layer tuned to have a proper work function for enhanced performance of the field effect transistor devices of integrated circuit 200. For example, in the depicted embodiment, where the field effect transistor devices are NFETs, the work function layer includes an n-type work function metal (n-metal), such as Ta, TiAl, TiAlN, TaCN, other n-type work function metal, or a combination thereof. Where the field effect transistor device is a PFET, the work function layer includes a p-type work function metal (p-metal), such as TiN, TaN, other p-type work function metal, or combination thereof. In furtherance of the present example, a conductive layer, such as an aluminum layer, is formed over the work function layer, such that the gate electrode layer 209 includes a work function layer disposed over the gate dielectric layer 207 and a conductive layer disposed over the work function layer.

Surrounding the gate stack 205 are the first spacers 211 and the second spacers 212. The gate stack 205 and the surrounding spacers, such as spacers 211 and 212, form a gate structure 206. The spacer layers may comprise SiN, oxynitride, SiC, SiON, oxide, and the like. However, as one of ordinary skill in the art will recognize, the first spacers 211 and the second spacers 212 as illustrated in FIG. 2A are intended to be merely illustrative and are not intended to limit the embodiments to these descriptions. Rather, any suitable number and combination of spacer layers and shapes may be utilized in order to form spacers for the gate stack 205, and any suitable combination of spacers may alternatively be utilized.

In some embodiments of forming an n-type transistor, n-type lightly-doped drains (LDDs) 219 can be formed in the substrate 201. Portions of the n-type LDDs 219 can be formed under the gate structure 205. The n-type LDDs 219 can be formed of n-type dopants (impurities). For example, the dopants can comprise phosphorous, arsenic, and/or other group V elements. In some embodiments, at least one thermal annealing process, e.g., a rapid thermal annealing (RTA) process, can be performed to activate the dopants of the n-type LDDs 219. In some embodiments of forming an n-type transistor, p-type pocket doped regions (not shown) can be formed in the substrate 201. The p-type pocket doped regions can be formed of p-type dopants (impurities). For example, the dopants can comprise boron and/or other group III elements.

FIG. 2A illustrates the formation of recesses 210 within the substrate 201. The recesses 210 may be formed using, e.g., a wet etch process selective to the material of the substrate 201 and uses the gate stack 205, the first spacers 211, and the second spacers 212 as a hard mask in order to form the recesses 210. For example, an etchant such as carbon tetrafluoride ($CF_4$), HF, tetramethylammonium hydroxide (TMAH), or combinations of thereof, or the like may be used to perform the wet etch and form the recesses 210. The recesses 210 provide an opening in the substrate 201 into which source/drain regions (whose formation is described further below with respect to FIGS. 2B-2E) will subsequently be formed.

Recess 210, formed below and between a spacer 212 surrounding gate structure 205 and a neighboring spacer 212 as shown in FIG. 2A, has a width $W_1$ of between about 50 Å and about 500 Å, in accordance with some embodiments. Recesses 210 may additionally undercut the first spacers 211 and/or the second spacers 212. Additionally, the wet etch process may be continued until the recesses 210 have a depth $D_1$ from a surface of the substrate 201. In some embodiments, $D_1$ is in a range from about 50 Å and about 600 Å. However, these dimensions are not intended to limit the present embodiments, as any suitable dimensions for the recesses 210 may alternatively be utilized.

The recesses 210 may be formed to have either an angular or rounded shape. In an embodiment in which the recesses 210 have an angular shape, the recesses 210 may be formed to have a first angle $\alpha_1$ along with top of the recesses 210 and a second angle $\alpha_2$ along the bottom of the recesses 210. In some embodiments, the first angle $\alpha_1$ is in a range from about 90° and about 180°. The second angle $\alpha_2$ is in a range from about 85° and about 170°, in accordance with some embodiments.

Referring to FIGS. 1 and 2B-2E, the method 100 can include forming an epitaxial silicon-containing material structure in each of the recesses (block 130). In some embodiments, the block 130 can include performing an epitaxial deposition/partial etch process and repeating the epitaxial deposition/partial etch process at least once. Such repeated deposition/partial etch process is also called a cyclic deposition/etch (CDE) process.

Figure 2B:
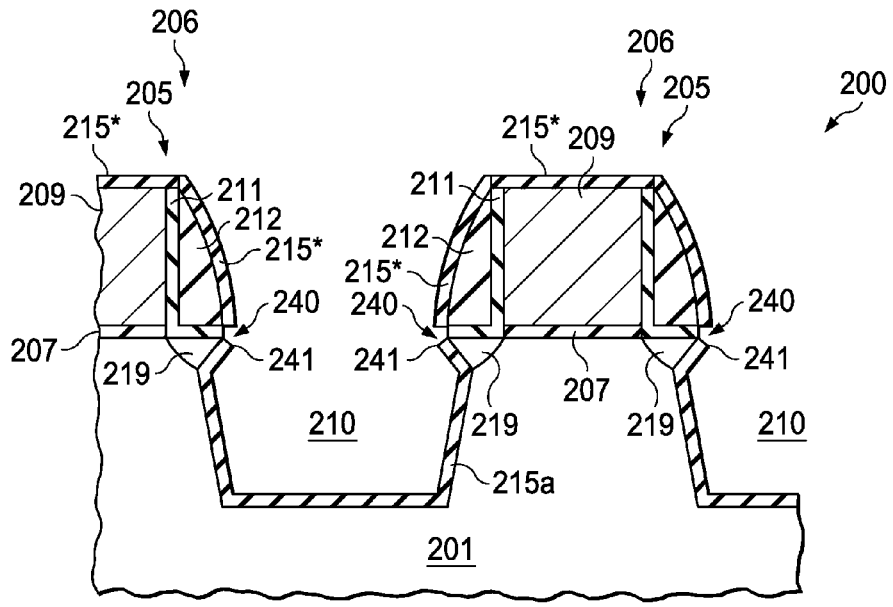
Figure 2C:
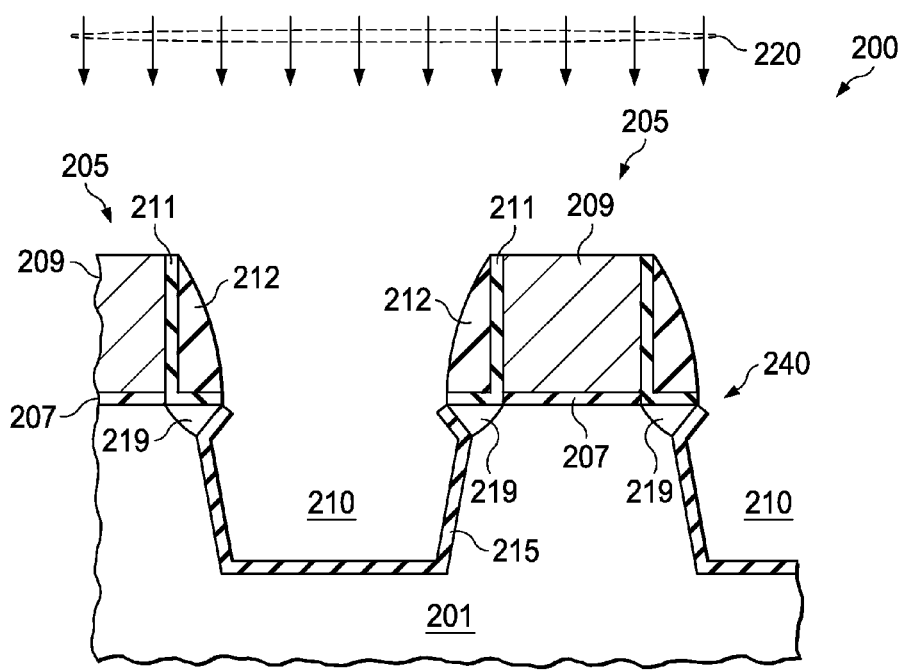
Figure 2D:
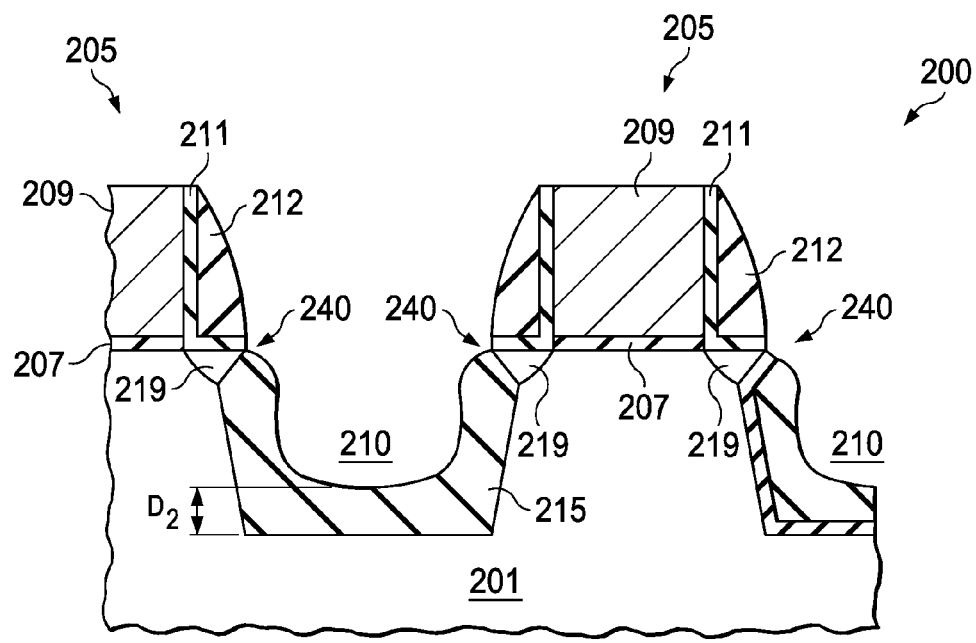
Figure 2E:
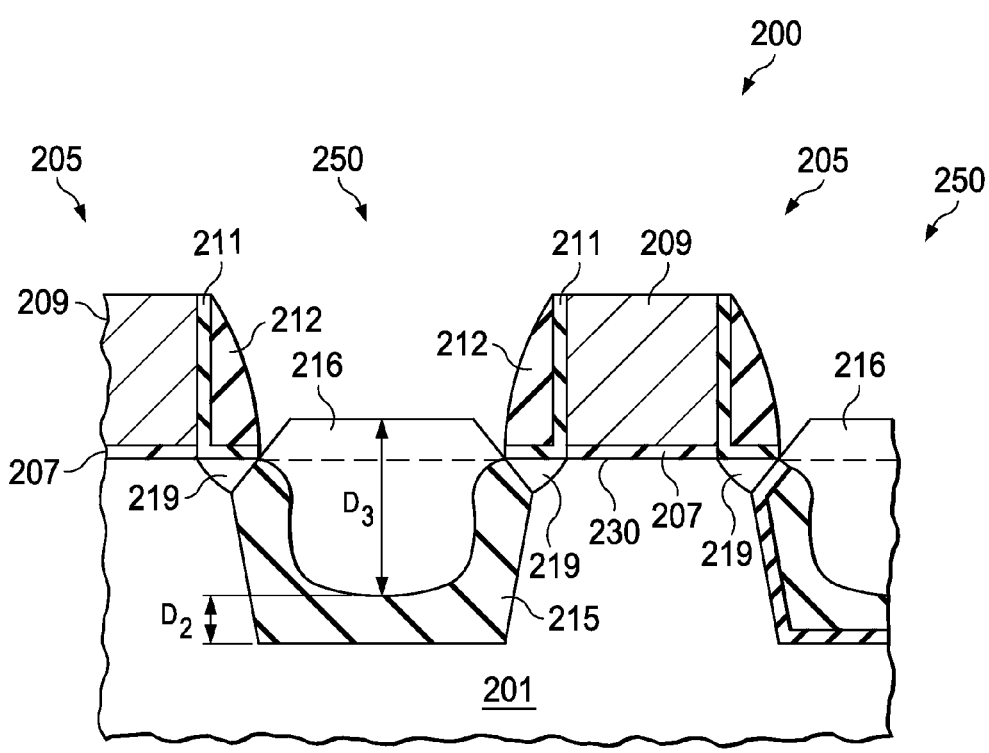

The block 130 may include epitaxially depositing a silicon-containing material (or layer) 215, in recesses 210 as shown in FIGS. 2B-2D, in accordance with some embodiments. Block 130 also may include depositing a silicon-containing layer 216 over the silicon-containing material 215 in recesses 210, as shown in FIG. 2E, in accordance with some embodiments.

The deposition of the silicon-containing material 215 includes in-situ doping the silicon-containing material 215, in accordance with some embodiments. For example, forming an n-type transistor can use an n-type doping precursor, e.g., phosphine ($PH_3$) and/or other n-type doping precursor. By using the in-situ doping process, the dopant profile of the silicon-containing material 215 can be desirably achieved. In some embodiments, the silicon-containing material 215 can be an n-type doped silicon layer that is doped with phosphorus (Si:P). In some embodiments, the silicon-containing material 215 can be an n-type doped silicon layer that is doped with both phosphorus and carbon (Si:CP). Carbon could impede the out-diffusion of phosphorus from the silicon-containing material 215. Other types of dopants may also be included. In some embodiments, the phosphorus dopant has a concentration in a range from about 0.1% to about 5% (atomic percent). In some embodiments, the carbon dopant has a concentration in a range from about 0.1% to about 5% (atomic percent).

In some embodiments, the silicon-containing material 215 can be formed by chemical vapor deposition (CVD), e.g., low pressure CVD (LPCVD), atomic layer CVD (ALCVD), ultrahigh vacuum CVD (UHVCVD), reduced pressure CVD (RPCVD), any suitable CVD; molecular beam epitaxy (MBE) processes; any suitable epitaxial process; or any combinations thereof. In some embodiments, the deposition of the silicon-containing material 215 can have a deposition temperature of about 750° C. or less. In other embodiments, the deposition temperature ranges from about 500° C. to about 750° C. The pressure of the deposition process can range from about 5 Torr to about 500 Torr.

The deposition of the silicon-containing material 215 can use at least one silicon-containing precursor, such as silane ($SiH_4$), disilane ($Si_2H_6$), trisilane ($Si_3H_8$), Dichlorosilane ($SiH_2Cl_2$), another silicon-containing precursor, and/or any combinations thereof. In some embodiments, the silicon-containing precursor can have a flow rate ranging from about 20 standard cubic centimeters per minute (sccm) to about 500 sccm. In other embodiments forming a p-type transistor, the silicon-containing material 215 can be made of at least one material, such as silicon, silicon germanium, other semiconductor materials, and/or any combinations thereof.

As mentioned above, the deposition of the silicon-containing material 215 includes in-situ doping the silicon-containing material 215, in accordance with some embodiments. For example, forming an n-type transistor can use an n-type doping precursor, e.g., phosphorous-containing gases such as phosphine ($PH_3$), arsenic-containing gases such as arsine ($AsH_3$), other n-type dopant-containing gases, or a combination thereof. In some embodiments, the n-type doping precursor can have a flow rate ranging from about 20 sccm to about 500 sccm. A carbon-containing gas, such as monomethylsilane (MMS), is also included to dope the silicon-containing material 215 with carbon, in accordance with some embodiments. In some embodiments, the carbon-containing gas has a flow rate ranging from about 10 sccm to about 600 sccm.

The silicon-containing material 215 in recesses 210 is epitaxial. The deposition process forms a thin epitaxial layer 215a of silicon-containing material in recesses 210 and an amorphous silicon-containing material 215* on gate electrode 209 and spacers 212, as shown in FIG. 2B in accordance with some embodiments. Referring to FIG. 2C, an etching (or partial etching) process 220 removes the amorphous silicon-containing material 215* and also a portion of the silicon-containing material 215a in recesses 210. The remaining silicon-containing material 215 is formed in each of the recesses 210. In some embodiments, the etching process 220 can use an etching gas including at least one of hydrogen chloride (HCl), chlorine ($Cl_2$), germanium hydride ($GeH_4$), other suitable etching gases, and/or any combinations thereof. The flow rate of the etching gas can range from about 50 sccm to about 750 sccm, in accordance with some embodiments. In some embodiments, the pressure of the etching process 220 ranges from about 5 Torr to about 500 Torr. In some embodiments, the etching process 220 can have an etching temperature of about 590° C. or less. In other embodiments, the etching temperature can range from about 500° C. to about 590° C. The process temperatures and pressures for the deposition process and etch process to form the silicon-containing material 215 are identical in some embodiments.

The etching process 220 would remove the amorphous silicon-containing material 215* over non-crystalline surface at a rate higher than the removal rate of epitaxial silicon-containing material 215. In addition, the etching process would remove a portion of epitaxial silicon-containing material 215 including the dislocations 241 near the gate corners 240.

The epitaxial deposition/partial etch process is repeated a number of times until a desired thickness $D_2$ is reached, as shown in FIG. 2D in accordance with some embodiments. As a result, such repeated deposition/partial etch process is called a cyclic deposition/etch (CDE) process. In some embodiments, $D_2$ is in a range from about 10 Å and about 500 Å. The dotted lines in recesses 210 are used to illustrate the multiple sub-layers formed by the epitaxial CDE process.

As mentioned above, the silicon-containing material 215 can be an n-type doped silicon layer that is doped with both phosphorus and carbon, in accordance with some embodiments. Carbon could impede the out-diffusion of phosphorus from the silicon-containing material 215. The phosphorus- and carbon-doped silicon layer can be referred to as a Si:CP layer. The dopants in the silicon-containing material 215 deposited by CDE have higher level of activation than implanted dopants. In some embodiments, the dopant activation level is in a range from about 2E20 atoms/$cm^3$ to about 6E20 atoms/$cm^3$. In contrast, the activation of implanted dopant at S/D is typically at about 1E20 to 2E20 atoms/$cm^3$ level. The higher activation level makes formation of in-situ doping of epitaxial grown silicon-containing desirable.

Following the CDE process, a selective epitaxial growth (SEG) process may be used to deposit additional silicon-containing film to fill the remaining recesses 210. The SEG process has a higher growth rate than the CDE process, in accordance with some embodiments. The SEG process is a selective deposition process and the silicon-containing film formed by this process deposits on epitaxial silicon-containing film, such as layer 215. SEG processes utilize simultaneous deposition and etch. In some embodiments, the surface of the silicon-containing layer 216, which is epitaxial, is leveled with silicon substrate surface 230. In some embodiments, the surface of the silicon-containing layer 216 is above silicon substrate surface 230, as shown in FIG. 2E. The thickness $D_3$ of the silicon-containing layer 216 is in a range from about 30 Å to about 400 Å, in some embodiments. In some embodiments, the silicon-containing layer 216 is doped with phosphorus (Si:P).

Layer 215 and layer 216 form the S/D regions 250. In some embodiments, the material and/or method of forming the silicon-containing layer 216 can be as same as or similar to those of the silicon-containing material 215. In some embodiments, the silicon-containing layer 216 may have a dopant concentration different from that of the silicon-containing material 215.

Figure 3A:
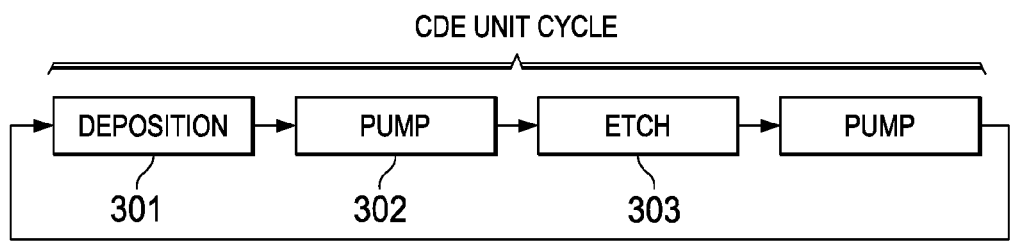
FIG. 3A is a process sequence of a CDE (cyclic deposition/etch) process in a process chamber, in accordance with some embodiments.

As mentioned above, the process to form the silicon-containing material 215 is a CDE process, which involves cyclic deposition and etch processes. FIG. 3A shows the process sequence of a CDE process 300 in a process chamber, in accordance with some embodiments. The process 300 include a deposition operation 301, a post-deposition pump operation 302, a partial-etch operation 303, and a post-etch pump operation 304, in accordance with some embodiments. The CDE process occurs in a process chamber. As mentioned above, the deposition operation 201 employs a silicon-containing gas, such as trisilane ($Si_3H_8$), di-silane ($Si_2H_6$), etc., as silicon source, and a dopant gas, such as $PH_3$, is also used to provide a dopant for the deposited silicon-containing material layer. In some embodiments, the pressure of the etching process 220 ranges from about 5 Torr to about 500 Torr. In some embodiments, the etching temperature can range from about 500° C. to about 590° C. In some embodiments, the deposition time is in a range from about 3 seconds to about 20 seconds. In some embodiments, the amount of the silicon-containing material 215 deposited in operation 301 is in a range from about 15 Å to about 80 Å during each CDE unit cycle, in accordance with some embodiments.

After deposition operation 301, a post-deposition pump operation 302 is used to remove the deposition gas from the process chamber. Once the chamber is removed of the deposition gases, the etch operation 303 follows. In some embodiments, the etch operation 303 employs HCl gas and $GeH_4$ gas. A non-reactive carrier gas, such as an inert gas, or $N_2$, is also used in the etch gas mixture in accordance with some embodiments. HCl and $GeH_4$ react with silicon to etch silicon. In some embodiments, $GeH_4$ acts as an etching catalyst to react with silicon to form SiGe, which is then removed by HCl. The etching temperature and pressure are maintained at the same levels as the deposition process, in some embodiments. The etch time is in a range from about 40 seconds to about 200 seconds, in some embodiments. The amount of the silicon-containing material 215 removed in operation 303 is in a range from about 5 Å and about 30 Å during each CDE unit cycle, in accordance with some embodiments.

Figure 3B:
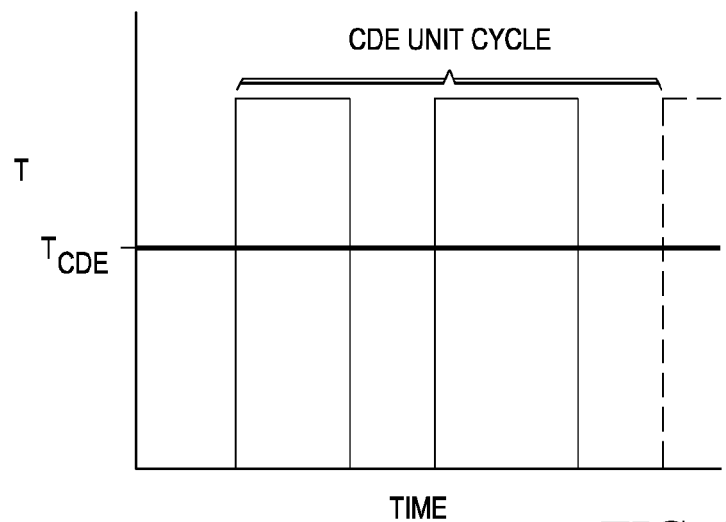
FIG. 3B shows process temperature of a CDE unit cycle, in accordance with some embodiments.
Figure 3C:
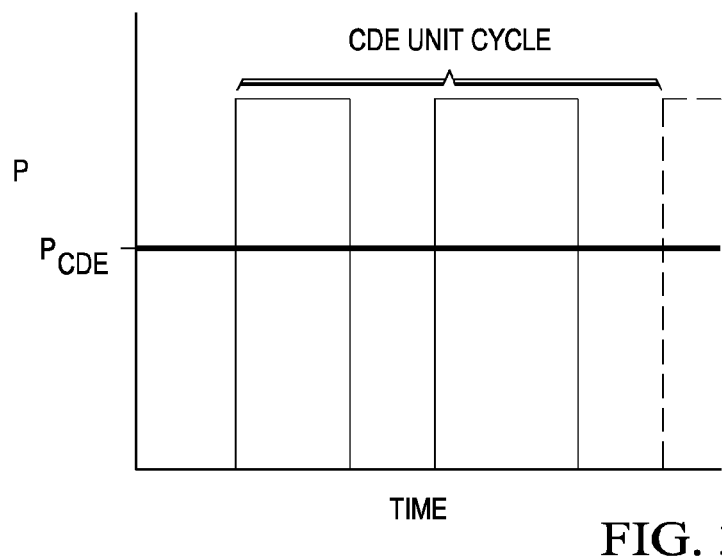
FIG. 3C shows process pressure of a CDE unit cycle, in accordance with some embodiments.

After the etching operation 303, the pump operation 304 follows to remove the etching gases used in operation 303 from the chamber. FIG. 3B shows process temperature of a CDE unit cycle when the process temperature is maintained constant (isothermal) $T_{CDE}$ throughout the CDE unit cycle, in accordance with some embodiments. FIG. 3C shows process pressure of a CDE unit cycle when the process pressure is maintained the same (isobaric) $P_{CE}$ during deposition and etching processes, in accordance with some embodiments. Using a CDE process with constant temperature (isothermal) and the same process pressure (isobaric) during deposition and etch operations has the advantage of good process control and chamber matching. In each CDE unit cycle, a net thickness in a range from about 10 Å and about 40 Å is formed in a unit cycle in accordance with some embodiments. After operation 304, the process sequence involving operations 301, 302, 303, and 304 repeat again until the targeted thickness $D_2$ of silicon-containing material 215 is reached.

In the CDE process described above, $GeH_4$ is used in the etching gas mixture as an etch catalyst. However, the Ge (germanium) in the $GeH_4$ could be incorporated in the silicon-containing material 215 unintentionally. The Ge incorporated in the silicon-containing material 215 could result in increase in resistivity of silicon-containing material 215. For advanced technology nodes, such as N20 and beyond, such increase of resistivity is unacceptable because of its negative effects on Ion (on current) and device performance. In order to remove $GeH_4$ from the gas mixture, the process condition needs to be adjusted to compensate for the loss of $GeH_4$ as the etch catalyst. Without the usage of $GeH_4$, HCl needs to be dissociated to react with silicon.

Figure 4:
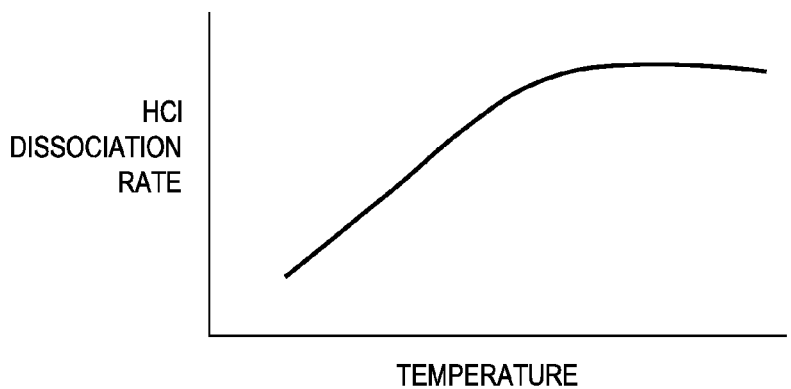
FIG. 4 shows a diagram of dissociation rate of HCl as a function of temperature, in accordance with some embodiments.

FIG. 4 shows a diagram of dissociation rate of HCl in the process chamber as a function of etch temperature, in accordance with some embodiments. The dissociation rate and reactivity of HCl increases with temperature. HCl dissociates into hydrogen and chlorine at high temperature. The etch rate of HCl becomes significant at a temperature near 600° C. Therefore, the etch temperature should be close to or higher than 600° C. In some embodiments, the etch temperature of the etch process without $GeH_4$ is in a range from about 600° C. to about 700° C. By setting the processing temperature of the etch process higher, the etch time can also be shortened to increase process throughput. In addition, the etch gas flow rate and pressure can be increased to increase the etch rate and to shorten etch process time.

Figure 5A:
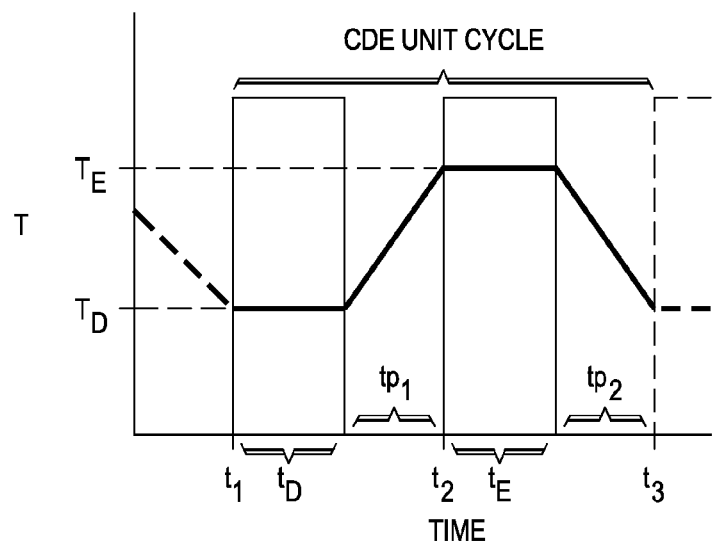
FIG. 5A shows a temperature diagram as a function of process time of a CDE unit cycle, in accordance with some embodiments.
Figure 5B:
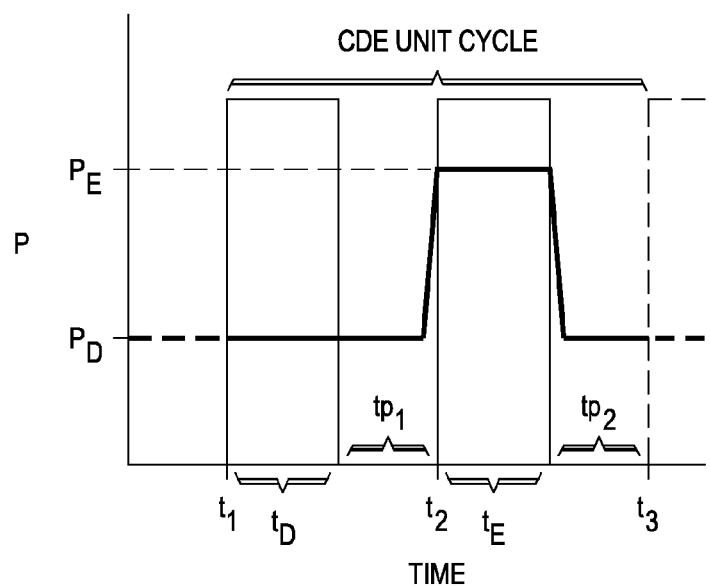
FIG. 5B shows a temperature diagram as a function of process time of a CDE unit cycle, in accordance with some embodiments.

FIG. 5A shows a temperature diagram as a function of process time of a CDE unit cycle, in accordance with some embodiments. FIG. 5A shows that the deposition occurs at $T_D$ and the etch occurs at $T_E$. FIG. 5B shows a pressure diagram as a function of process time of a CDE unit cycle, in accordance with some embodiments. FIG. 5B shows that the deposition pressure occurs at $P_D$ and at $P_E$ for the etch.

The deposition process gas mixture has been described above. $T_D$ is in a range from about 500° C. to about 590° C., in accordance with some embodiments. $T_E$ is in a range from about 600° C. to about 670° C., in accordance with some embodiments. $P_D$ is in a range from about 5 Torr to about 100 Torr, in accordance with some embodiments. $P_E$ is in a range from about 50 Torr to about 500 Torr, in accordance with some embodiments. The flow rate of HCl is in a range from about 50 sccm to about 30 slm (standard liters per minute). A non-reactive carrier gas, such as an inert gas, or $N_2$, is also used in the etch gas mixture in accordance with some embodiments. In some embodiments, the carrier gas a flow rate in a range from about 2 slm to about 10 slm.

The deposition process starts at $t_1$ and occurs for the duration of $t_D$. As mentioned above, the deposition time ($t_D$) is in a range from about 3 seconds to about 20 seconds. The etch process starts at $t_2$ and occurs for the duration of $t_E$. The next CDE unit cycle starts at $t_3$. With the process change in the etch process, which is without $GeH_4$, has higher process temperature and pressure than the deposition process and a higher flow rate of HCl compared to the etch process described above, the etch time ($t_E$) is also in a range from about 3 seconds to about 30 seconds, which time and range are shorter than the time and range of from about 40 seconds to about 200 seconds described above.

Using the processing conditions described above along with FIGS. 5A and 5B, the CDE process does not involve GeH$_4$ as a catalyst, which enables no Ge incorporation in the silicon containing material 215. The resistance of silicon containing material 215 without Ge incorporation is reduced consistently across the wafer to a range from about 0.2 mohm-cm to about 0.6 mohm-cm, in accordance with some embodiments. Further, by increasing the processing temperature of the etch process in the CDE unit cycle, the etch process time is greatly reduced. Consequently, the throughputs of the CDE unit cycle and overall CDE process are increased.

FIGS. 5A and 5B show that there are temperature ramp-up time, $t_{p1}$, and temperature ramp-down time, $t_{p2}$, to ensure temperatures of the CDE process chamber, substrate holder, and substrate of the CDE process chamber reach the targeted values. To enable fast rise and fall of process temperatures, the process chamber needs to have proper temperature control system. For example, good thermal sensing devices and sufficient heating and cooling elements are needed. In some embodiments, $t_{p1}$, is in a range from about 5 seconds to about 300 seconds. In some embodiments, tp2, is in a range from about 5 seconds to about 300 seconds.

As noted, the processes of the method 100 described above in conjunction with FIGS. 1, 2A-2E, 3A-3C, and 5A-5B are merely exemplary. The method 100 can include different steps according to different process flows. For example, the gate structure 205 can be formed by a gate-first process or a gate-last process. In some embodiments using a gate-last process, the method 100 can include a gate replacing process. The gate structure 205 can be a dummy gate structure. The dummy gate structure 205 can each include a dummy gate material and a hard mask material formed thereover. The dummy gate material can be made of at least one material such as polysilicon, amorphous silicon, silicon oxide, silicon nitride, a material having an etching rate that is substantially different from the spacers (shown in FIG. 2A).

For the gate-last process, the hard mask materials and the dummy gate materials can be removed, for example, by a wet etch process, a dry etch process, or any combinations thereof. After removing the dummy gate materials, the method 100 can include forming gate electrode material within openings in which the dummy gate materials are disposed. In some embodiments, the gate electrode material can be a stack structure including a diffusion barrier layer, a metallic work function layer, a metallic conductive layer, and/or other suitable material layers.

The embodiments of mechanisms for forming source/drain (S/D) regions of field effect transistors (FETs) descried enable forming an epitaxially grown silicon-containing material without using GeH$_4$ in an etch gas mixture of an etch process for a cyclic deposition/etch (CDE) process. The etch process is performed at a temperature different from the deposition process to make the etch gas more efficient. As a result, the etch time is reduced and the throughput is increased.

In some embodiments, a method of forming an integrated circuit is provided. The method includes forming a plurality of gate structures over a substrate, and removing portions of the substrate to form recesses adjacent to the plurality of gate structures. The method also includes depositing a first epitaxial silicon-containing layer in the recesses, and depositing the first epitaxial silicon-containing layer uses a cyclic deposition etching (CDE) process. The CDE process has a CDE unit cycle, and the CDE unit cycle has a deposition process and an etch process. The CDE unit cycle uses an etch temperature of the etch process is different from a deposition temperature of the deposition process in the CDE unit cycle. The method further includes depositing a second epitaxial silicon-containing layer over the first epitaxial silicon-containing layer to form source and drain regions next to the plurality of gate structures.

In some other embodiments, a method of forming an integrated circuit is provided. The method includes forming a plurality of gate structures over a substrate, and removing portions of the substrate to form recesses adjacent to the plurality of gate structures. The method also includes depositing a first epitaxial silicon-containing layer in the recesses, and depositing the first epitaxial silicon-containing layer uses a cyclic deposition etching (CDE) process. The CDE process has a CDE unit cycle, and the CDE unit cycle has a deposition process and an etch process. The CDE unit cycle uses an etch temperature of the etch process is higher from a deposition temperature of the deposition process in the CDE unit cycle. The method further includes depositing a second epitaxial silicon-containing layer over the first epitaxial silicon-containing layer to form source and drain regions next to the plurality of gate structures.

In yet some other embodiments, an integrated circuit is provided. The integrated circuit includes a gate structure disposed over a substrate, and a silicon-containing material structure formed in and over a recess adjacent to the gate structure. The silicon-containing material structure includes a first epitaxial layer and a second epitaxial layer. The first epitaxial layer has a resistance in a range from about 0.2 mohm-cm to about 0.6 mohm-cm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, the method comprising:

forming a plurality of gate structures over a substrate;

removing portions of the substrate to form respective recesses adjacent to the plurality of gate structures;

depositing a first epitaxial silicon-containing layer in the recesses, wherein depositing the first epitaxial silicon-containing layer uses a cyclic deposition etching (CDE) process, wherein the CDE process has a CDE unit cycle, wherein the CDE unit cycle has a deposition process and an etch process, wherein the CDE unit cycle uses an etch temperature of the etch process that is different from a deposition temperature of the deposition process in the CDE unit cycle; and wherein the CDE process includes a deposition, a pump after deposition, an etch, and a pump after etch in each deposition and etch cycle, and wherein the CDE process is performed in the same process chamber; and depositing a second epitaxial silicon-containing layer over the first epitaxial silicon-containing layer to form respective source and drain regions next to the plurality of gate structures.

2. The method of claim 1, wherein the etch temperature is higher than the deposition temperature in the CDE unit cycle.

3. The method of claim 2, wherein the etch temperature used enables no usage of $GeH_4$ in an etch gas mixture of the etch process.

4. The method of claim 1, wherein the etch process of the CDE unit cycle uses $GeH_4$.

5. The method of claim 1, wherein the etch temperature is in a range from about 600° C. to about 700° C.

6. The method of claim 1, wherein the deposition temperature is in a range from about 500 ° C. to about 590° C.

7. The method of claim 1, wherein a pressure of the etch process is in a range from about 50 Torr to about 500 Torr.

8. The method of claim 1, wherein a pressure of the deposition process is in a range from about 5 Torr to about 100 Torr.

9. The method of claim 1, wherein a flow rate of HCl gas used in the etch process is in a range from about 50 sccm to about 30 slm.

10. The method of claim 1, wherein an etch time for the CDE unit cycle is in a range from about 3 second to about 30 second.

11. The method of claim 1, wherein etch gases of the etching process of the CDE unit cycle include HCl.

12. The method of claim 1, wherein the recesses have a depth in a range from about 200 Å to about 400 Å.

13. The method of claim 1, wherein a thickness of the first epitaxial silicon-containing layer is in a range from about 70 Å to about 300 Å, wherein the first epitaxial silicon-containing layer is doped with phosphorus and carbon, wherein the concentration of the phosphorus is in a range from about 0.3% to about 2%.

14. The method of claim 1, wherein a resistivity of the first epitaxial silicon-containing layer is in a range from about 0.2 mohm-cm to about 0.6 mohm-cm.

15. A method of forming an integrated circuit, the method comprising:
forming a plurality of gate structures over a substrate;
removing portions of the substrate to form recesses adjacent to the plurality of gate structures;
depositing a first epitaxial silicon-containing layer in the recesses, wherein depositing the first epitaxial silicon-containing layer uses a cyclic deposition etching (CDE) process, wherein the CDE process has a CDE unit cycle, wherein the CDE unit cycle has a deposition process and an etch process, wherein the CDE unit cycle uses an etch temperature of the etch process that is higher than a deposition temperature of the deposition process in the CDE unit cycle; and
wherein the CDE process includes a deposition, a pump after deposition, an etch, and a pump after etch in each deposition and etch cycle, and wherein the CDE process is performed in the same process chamber; and
depositing a second epitaxial silicon-containing layer over the first epitaxial silicon-containing layer to form source and drain regions next to the plurality of gate structures.

16. A method of forming an integrated circuit, the method comprising:
forming a of gate structures over a substrate, the gate structure including a gate dielectric and a gate electrode formed thereon;
forming gate spacers on sidewalls of the gate structure;
using the gate structure and gate spacers as a mask, etching portions of the substrate to form respective recesses aligned with edges of the gate spacers;
depositing a first epitaxial silicon-containing layer in the recesses, wherein depositing the first epitaxial silicon-containing layer uses a cyclic deposition etching (CDE) process, wherein the CDE process has a CDE unit cycle, wherein the CDE unit cycle has a deposition process and an etch process, wherein the CDE unit cycle uses an etch temperature of the etch process that is different from a deposition temperature of the deposition process in the CDE unit cycle; and
wherein the CDE process includes a deposition, a pump after deposition, an etch, and a pump after etch in each deposition and etch cycle, and wherein the CDE process is performed in the same process chamber; and
depositing a second epitaxial silicon-containing layer over the first epitaxial silicon-containing layer to form respective source and drain regions next to the plurality of gate structures.

17. The method of claim 16, wherein the etch temperature is in a range from about 600° C. to about 700° C. and the deposition temperature is in a range from about 500° C. to about 590° C.

18. The method of claim 16, wherein a pressure of the etch process is in a range from about 50 Torr to about 500 Torr and a pressure of the deposition process is in a range from about 5 Torr to about 100 Torr.

19. The method of claim 16, wherein etching portions of the substrate includes undercutting the respective spacers.

20. The method of claim 16, wherein the etching process uses an etching gas including a gas selected from the group consisting of hydrogen chloride (HCl), chlorine ($Cl_2$), germanium hydride ($GeH_4$), and combinations thereof.

* * * * *